United States Patent
Ye et al.

(10) Patent No.: US 11,736,124 B2
(45) Date of Patent: Aug. 22, 2023

(54) SYSTEM AND METHOD FOR DECODING REED-MULLER CODES

(71) Applicants: The Trustees of Princeton University, Princeton, NJ (US); Ecole Polytechnique Fédérale de Lausanne (EPFL), Lausanne (CH)

(72) Inventors: Min Ye, West Windsor, NJ (US); Emmanuel Abbe, Lausanne (CH)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 17/422,923

(22) PCT Filed: Jan. 17, 2020

(86) PCT No.: PCT/US2020/014079
§ 371 (c)(1),
(2) Date: Jul. 14, 2021

(87) PCT Pub. No.: WO2020/150600
PCT Pub. Date: Jul. 23, 2020

(65) Prior Publication Data
US 2022/0109457 A1      Apr. 7, 2022

Related U.S. Application Data

(60) Provisional application No. 62/793,769, filed on Jan. 17, 2019.

(51) Int. Cl.
*H03M 13/13* (2006.01)
*H03M 13/43* (2006.01)
*H03M 13/25* (2006.01)
*H03M 13/29* (2006.01)

(52) U.S. Cl.
CPC ......... *H03M 13/136* (2013.01); *H03M 13/43* (2013.01); *H03M 13/253* (2013.01); *H03M 13/2948* (2013.01)

(58) Field of Classification Search
CPC ........................... H03M 13/136; H03M 13/43
See application file for complete search history.

(56) References Cited

U.S. PATENT DOCUMENTS 5,926,488 A    7/1999 Khayrallah
6,023,783 A    2/2000 Divsalae et al.
(Continued)

OTHER PUBLICATIONS

Rafaël Fourquet and Cédric Tavernier; An improved list decoding algorithm for the second order Reed-Muller codes and its applications, Published online: Mar. 19, 2008, Springer Science+Business Media, LLC 2008 (Year: 2008).*

(Continued)

*Primary Examiner* — Joseph D Torres
(74) *Attorney, Agent, or Firm* — Meagher Emanuel Laks Goldberg & Liao, LLP

(57) ABSTRACT

Various embodiments are directed to Reed-Muller decoding systems and methods based on recursive projections and aggregations of cosets decoding, exploiting the self-similarity of RM codes, and extended with list-decoding procedures and with outer-code concatenations. Various embodiments are configured for decoding RM codes (and variants thereof) over binary input memoryless channels, such as by, for each received word of RM encoded data, projecting the received word onto each of a plurality of cosets of different subspaces to form thereby a respective plurality of projected words; recursively decoding each of the respective plurality of projected words to form a respective plurality of decoded projected words; and aggregating each of the respective decoded projected words to obtain thereby a decoding of the corresponding received word of RM encoded data.

16 Claims, 5 Drawing Sheets

(56) References Cited

U.S. PATENT DOCUMENTS

| | | | |
|---|---|---|---|
| 6,690,738 | B1 | 2/2004 | Swenson et al. |
| 6,990,626 | B2 | 1/2006 | Ashikhmin |
| 7,331,012 | B2 | 2/2008 | Vasic et al. |
| 8,386,879 | B2 | 2/2013 | Djordjevic et al. |
| 9,503,126 | B2 | 11/2016 | Vardy et al. |
| 2004/0064779 | A1 | 4/2004 | Vasic et al. |
| 2008/0209304 | A1 | 8/2008 | Winarski et al. |
| 2009/0141690 | A1* | 6/2009 | Fan ................ H04L 1/0026 370/335 |
| 2012/0185755 | A1 | 7/2012 | Orlik et al. |
| 2013/0117344 | A1 | 5/2013 | Gross et al. |
| 2014/0019820 | A1 | 1/2014 | Vardy et al. |
| 2014/0153625 | A1 | 6/2014 | Vojcic et al. |
| 2016/0352463 | A1 | 12/2016 | Vojcic et al. |

OTHER PUBLICATIONS

International Search Report and Written Opinion for corresponding PCT Application No. PCT/US2020/014079, dated Jun. 11, 2020.

Saleemi, "Coding Theory via Groebner Bases", Technischen Universitat Hamburg-Harburg, Feb. 14, 2012.

5GMF White Paper, 5G Mobile Communications Systems for 2020 and Beyond, Version 1.1, 5GMF The Fifth Generation Mobile Communications Promotion Forum, Sep. 29, 2017.

Goela, et al., "Polar Codes for Broadcast Channels", Information Theory, IEEE Transactions, arXiv:1301.6150v1 [cs.IT], Jan. 25, 2013.

European Search Report for corresponding EP Application No. 20741704, dated Oct. 17, 2022.

Min Ye et al: "Recursive projection-aggregation decoding of Reed-Muller codes", arxiv.org, Cornell University Library, 201 Olin Library Cornell University, Ithaca, NY, 14853, pp. 1-21, XP081025317, Feb. 4, 2019.

Burnashev et al., "Error Exponents for Two Soft-Decision Decoding Algorithms of Reed-Muller Codes", IEEE Transactions on Information Theory, IEEE, USA, vol. 55, No. 9, pp. 4108-4118, XP011272416, Sep. 1, 2009.

Chen et al, "Research and implementation of an improved reed decoding algorithm", Proc. 6th International Conference on Signal Processing 2002, Aug. 26-30, 2002, Piscataway, NJ, USA, IEEE, vol. 2, pp. 1762-1765, XP010627884, Aug. 26, 2002.

\* cited by examiner

SYSTEM AND METHOD FOR DECODING REED-MULLER CODES

CROSS-REFERENCE TO RELATED APPLICATION

This application claims the benefit of provisional patent application Ser. No. 62/793,769 filed on Jan. 17, 2019, entitled SYSTEMS AND METHODS OF DECODING REED-MULLER CODES, which provisional patent application is incorporated herein by reference in its entirety.

FIELD OF THE DISCLOSURE

The present disclosure relates generally to systems and methods for information encoding and decoding and, more particularly, to methods for decoding Reed-Muller (RM) codes and variants thereof.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Reed-Muller (RM) codes are among the oldest families of error-correcting codes. As compared to polar codes, RM codes have in particular the advantage of having a simple and universal code construction, though RM codes do not possess yet the generic analytical framework of polar codes (i.e., polarization theory). It has been shown that RM codes achieve capacity on the Binary Erasure Channel (BEC) at constant rate, as well as for extremal rates for BEC and Binary Symmetric Channels (BSC), but obtaining such results for a broader class of communication channels and rates remains open.

Unfortunately, an important missing component is for RM codes is that of a guaranteed efficient decoder for RM codes that is competitive in the low rate/block-length regime.

SUMMARY OF THE INVENTION

Various deficiencies in the prior art are addressed below by the disclosed systems, methods and apparatus configured for decoding Reed-Muller codes (and variants thereof) over any binary input memoryless channels. Various embodiments include decoders based on recursive projections and aggregations of cosets decoding, exploiting the self-similarity of RM codes, and extended with list-decoding procedures and with outer-code concatenations. Various embodiments include RM decoders of particular utility within the context of specific regimes of interest, such as short code length (e.g., ≤1024 bits) and low code rate (e.g., ≤0:5) regimes contemplated for use within the emerging 5G communications and Internet of Things (IoT) applications.

A method for decoding Reed-Muller (RM) encoded data according to one embodiment comprises: for each received word of RM encoded data, projecting the received word onto each of a plurality of cosets of different subspaces to form thereby a respective plurality of projected words; recursively decoding each of the respective plurality of projected words to form a respective plurality of decoded projected words; and aggregating each of the respective decoded projected words to obtain thereby a decoding of the corresponding received word of RM encoded data.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
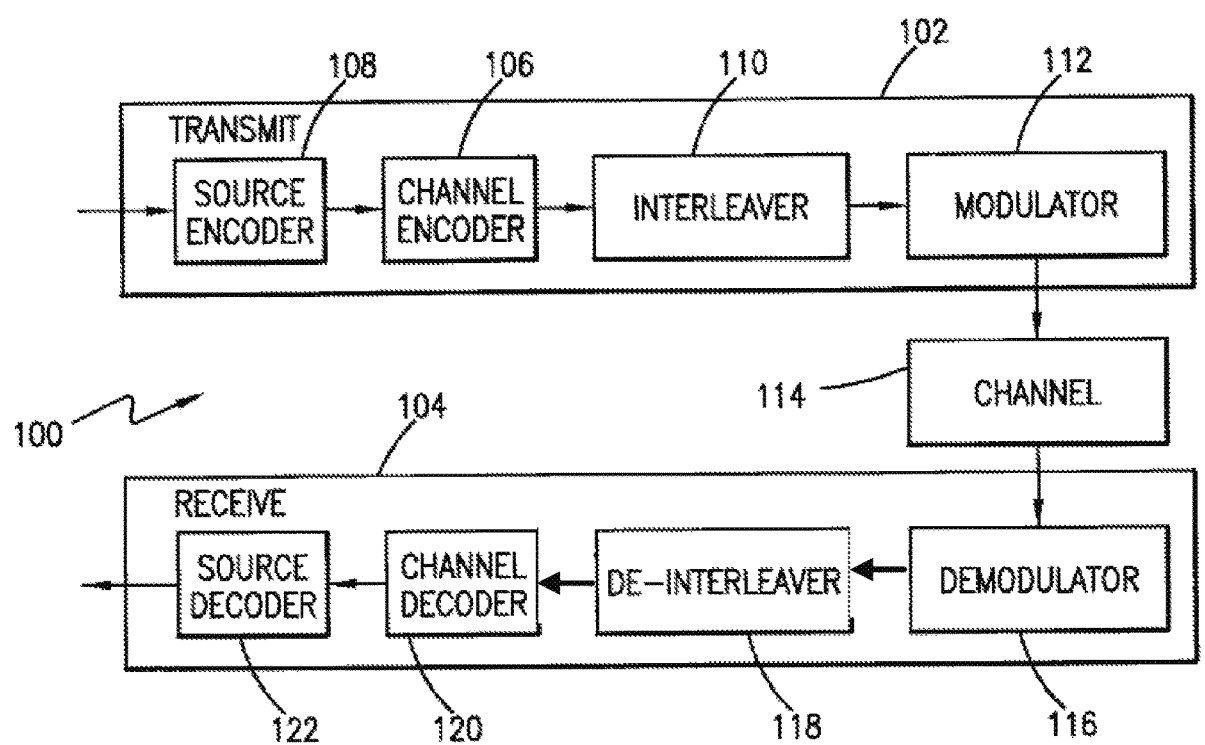
FIG. 1 is a functional block diagram of a block coding system benefiting from the various embodiments.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments, such as seismology and data fusion.

Various deficiencies in the prior art are addressed below by the disclosed systems, methods and apparatus configured for decoding Reed-Muller codes over any binary input memoryless channels. Various embodiments include decoders based on recursive projections and aggregations of cosets decoding, exploiting the self-similarity of RM codes, and extended with list-decoding procedures and with outer-code concatenations. Various embodiments include RM decoders of particular utility within the context of specific regimes of interest, such as short code length (e.g., ≤1024 bits) and low code rate (e.g., ≤0:5) regimes contemplated for use within the emerging 5G communications and Internet of Things (IoT) applications.

FIG. 1 depicts a high level block diagram of a block coding/decoding system benefiting from the various embodiments. Specifically, FIG. 1 depicts a block diagram of a block coding/decoding system 100 including a transmit side 102 and a receive side 104.

On the transmit side 102, the system 100 includes an (n,k;d) linear block channel encoder 106 wherein a block of "k" information bits received from an information source encoder 108 is encoded to output a codeword of "n" bits in length (wherein n>k). The channel encoder 106 preferably implements an error control code. An example of the information source encoder 108 is a vocoder or data compressor. The code words output from the channel encoder 106 are then optionally rearranged by an interleaver 110. A modulator 112 then maps the rearranged code words into waveforms suited for transmission over a communications channel 114. Modulator 112 may comprise, illustratively, a known modulator having an M-ary signal constellation (e.g., quadrature amplitude modulation (QAM), phase shift keying (PSK) and the like). The communications channel 114 may comprise a wired or wireless medium which suffering from error and/or distortion introducing problems such as fading, interference, noise and the like.

On the receive side 104, the system 100 includes an appropriate demodulator 116 that demodulates the communications channel 114 transmitted communication and outputs the rearranged code words. The estimated code words are then reordered (i.e., de-rearranged) by a de-interleaver 118 if necessary. An (n,k;d) linear block channel decoder 120 then processes the reordered estimated code words to generate estimates of the information bits for output to an information source decoder 122. The channel decoder 120 preferably comprises a maximum likelihood decoder for the selected error control code which utilizes soft decision decoding.

The block coding/decoding system 100 of FIG. 1 benefits from the use of RM channel encoding/decoding functions such as discussed herein, and especially the recursive projection-aggregation decoding of RM codes as discussed herein. The remaining discussion will assume that RM encoded data generated by, for example, the channel encoder 106 is subsequently decoded by the channel decoder 120. As such, the functions of the channel decoder 120 and similar structures will be the focus of the following discussion.

The system 100 of FIG. 1 is illustrative of only one example of a use for the various embodiments described herein. In particular, it is noted that while FIG. 1 depicts a system wherein various embodiments of decoders and/or decoding methods are used within the context of a data transmitting/receiving system, the various embodiments also find utility within the context of data storage systems.

Generally speaking, the various embodiments find utility within the context of any system, method or component thereof wherein RM or related encoding/decoding is used. Further, the various embodiments may be used in conjunction or concatenation with other codes, such as in the form of outer-codes, inner-codes, or any other components of various coding schemes.

Recursive Projection-Aggregation (RPA) Decoding Embodiments

Various embodiments are based on the observations of the inventors that drawbacks in polar codes and, in particular, CRC-aided polar codes at short to medium block lengths arise from inherent weakness of the polar code itself The inventors note that advantages of Reed-Muller (RM) codes over polar codes include: (1) better performance at short to medium block length in agreement with better scaling law, and (2) simple and universal code construction that is independent of the channels. As such, the inventors have disclosed herein various encoding and decoding methods, apparatus and computer implementations thereof that provide greatly improved error-correcting performance of RM codes over both previous decoding methods for RM codes and polar codes with the same parameters. The disclosed methods, apparatus and computer implementations thereof also allow for natural parallel implementations, in contrast to the Successive Cancellation List (SCL) decoder of polar codes.

RM codes are a family of error correcting codes that allow for data compression and transmission, such as to facilitate the transfer of information from a transmitter to a receiver over a noisy medium (e.g., as happens in cell phones, computer hard disks, deep-space communications, etc.). The various embodiments provide new decoding methods for RM codes as well as, in some embodiments, modifications of the RM codes themselves. The disclosed methods, apparatus and computer implementations thereof provide excellent performance in low code rate (≤1/2) and short code length (≤1024) regimes.

As described in detail herein, various embodiments comprise systems, methods, apparatus, mechanisms, algorithms and the like for efficiently decoding RM codes over binary input (typically) memoryless channels. Various embodiments are based on projecting the code and reducing its parameters, recursively decoding the projected codes, and aggregating the reconstructions. These exploit in particular the self-similarity structure of RM codes ensuring that quotient space codes for RM codes are again RM codes. Also provided are embodiments further providing list-decoding and code concatenation extensions of the various embodiments.

It is noted that the RPA algorithms/decoders described herein, and variations thereof, with list decoding is able to achieve an optimal performance of maximum likelihood decoding in some of the regimes at low block-length and rate. Further, the RPA algorithms/decoders and variants thereof without list decoding provide improved performance when compared to polar code algorithms/decoders plus CRC, and without requiring the addition of a list decoding procedure. In this manner, the various embodiments provide near optimal performance for practical regimes of parameters, and with an improved computation and power consumption due such as when avoiding list decoding procedures.

The discussion of the various embodiments will be provided in accordance with the following notation and background on RM codes. The term $\oplus$ is used herein to denote sums over $F_2$ such as a polynomial ring $F_2[Z_1, Z_2, \ldots, Z_m]$ of m variables. Since $Z^2=Z$ in $F_2$, the following set of $2^m$ monomials forms a basis of $F_2[Z_1, Z_2, \ldots, Z_m]$:

$$\left\{ \prod_{i \in A} Z_i : A \subseteq [m] \right\}, \text{ where } \prod_{i \in \emptyset} Z_i := 1.$$

The next step is to associate every subset $A \subseteq [m]$ with a row vector $v_m(A)$ of length $2^m$, whose components are indexed by a binary vector $z=(z_1, z_2, \ldots, z_m) \in \{0,1\}^m$. The vector $v_m(A)$ is defined as follows:

$$v_m(A,z) = \prod_{i \in A} Z_i \quad \text{(eq. 1)}$$

where $v_m(A,z)$ is the component of $v_m(A)$ indexed by z. That is, $v_m(A,z)$ is the evaluation of the monomial $\prod_{i \in A} Z_i$ at z. For $0 \leq r \leq m$, the set of vectors $$\{v_m(A) : A \subseteq [m], |A| \leq r\}$$

forms a basis of the r-th order Reed-Muller code RM(m, r) of length $n := 2^m$ and dimension $\sum_{i=0}^{r} \binom{m}{i}$.

Definition 1. The r-th order Reed-Muller code RM (m, r) code is defined as the following set of binary vectors:

$$RM(m, r) := \left\{ \sum_{A \subseteq [m], |A| \leq r} u(A) v_m(A) : u(A) \in \{0, 1\} \text{ for all } A \subseteq [m], |A| \leq r \right\}.$$

In other words, each vector $v_m(A)$ consists of all the evaluations of the monomial $\prod_{i \in A} Z_i$ at all the points in vector space $E := F_2^m$, and each codeword $c \in RM(m, r)$ corresponds to an m-variate polynomial with degree at most r. The coordinates of the codeword c are also indexed by the binary vectors $z \in E$, such that $c = (c(z), z \in E)$. Let B be an s-dimensional subspace of E, where $s \leq r$. The quotient space E/B consists of all the cosets of B in E, where every coset T has form $T = z + B$ for some $z \in E$. For a binary vector $y = (y(z), z \in E)$, we define its projection on the cosets of B as:

$$y_{/B} = \text{Proj}(y, B) := (y_{/B}(T), T \in E/B), \text{ where } y_{/B}(T) := \oplus_{z \in T} y \quad \text{(eq. 2)}$$

which is the binary vector obtained by summing up all the coordinates of y in each coset $T \in E/B$. Here the sum is over $F_2$ and the dimension of $y_{/B}$ is n/|B|.

By way of example, if c is a codeword of RM(m, r), then $c_{/B}$ is a codeword of RM(m−s, r−s), where s is the dimension of B. Various embodiments address the case s=1; namely, one-dimensional subspaces. More precisely, let $y=(y(z), z \in E)$ be the output vector of transmitting a codeword of RM(m, r) over some BSC channel.

Figure 2:
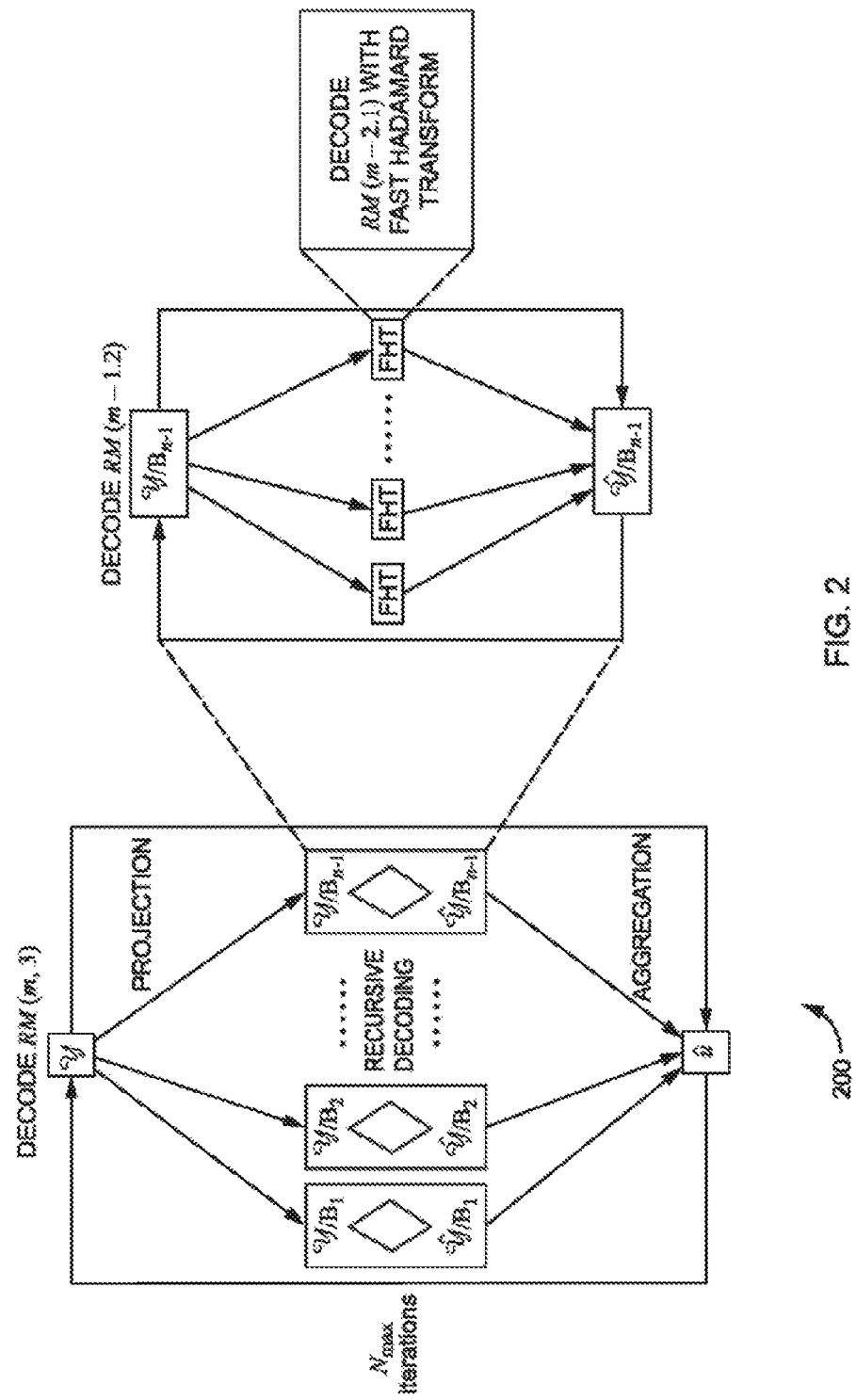
FIG. 2 graphically depicts a Recursive Projection-Aggregation decoding algorithm for third order RM codes according to an embodiment.

FIG. 2 graphically depicts a Recursive Projection-Aggregation decoding algorithm for third order RM codes according to an embodiment. Specifically, FIG. 2 and Algorithm 1 (below) together depict an exemplary decoding algorithm.

The depicted decoding algorithm is defined in a recursive manner: For every one-dimensional subspace B, projection $y_{/B}$ is obtained. Then the decoding algorithm is used for RM(m−1, r−1) to decode $y_{/B}$, where the decoding result is denoted as $\widehat{y_{/B}}$. Since every one-dimensional subspace of E consists of 0 and a non-zero element, there are n−1 such subspaces in total. After the projection and recursive decoding steps, n−1 decoding results are obtained as $\widehat{y_{/B_1}}, \widehat{y_{/B_2}}, \ldots, \widehat{y_{/B_{n-1}}}$. A majority voting scheme is then used to aggregate these decoding results together with y to obtain a new estimate $\hat{y}$ of the original codeword. Then y is updated as $\hat{y}$, and the entire procedure is performed again for up to $N_{max}$ rounds. It is noted that if $y=\hat{y}$ (see line 6), then y is a fixed (stable) point of the algorithm and will remain unchanged for the next iterations. In this case, the iteration is exited at line 1 (see lines 6-8). In various embodiments, a maximal number of iterations is set as Nmax=$\lceil m/2 \rceil$ to prevent the program from running into an infinite loop, and typically $\lceil m/2 \rceil$ iterations are enough for the algorithm to converge to a stable y.

This high-level description is summarized in FIG. 2 and Algorithm 1 (below). While this description focuses on the decoding algorithm over BSC, other embodiments discussed below extend the algorithm based on log-likelihood ratios (LLRs) that allow the decoding of RM codes over any binary-input memoryless channels, including the AWGN channel.

---

Algorithm 1 Pseudo-Code: The RPA_RM Decoding Function For BSC
Algorithm 1 the RPA_RM decoding function for BSC

---

Input: The corrupted codeword $y = (y(z), z \in \mathbb{E})$; the parameters of the Reed-Muller code m and r; the maximal number of iterations $N_{max}$
Output: The decoded codeword $\hat{c}$ 1: for $j = 1, 2, \ldots, N_{max}$ do
2:   $y_{/\mathbb{B}_i} \leftarrow \text{Proj}(y\mathbb{B}_i)$ for $i = 1, 2, \ldots, 2^m - 1$    ▷ Projection
3:   $\hat{y}_{/\mathbb{B}_i} \leftarrow \text{RPA\_RM}(y_{/\mathbb{B}_i}, m - 1, r - 1, N_{max})$ for $i = 1, 2, \ldots, 2^m - 1$    ▷ Recursive decoding
4:   ▷ If r = 2, then we use the Fast Hadamard Transform to decode the first-order RM code [8]
5:   $\hat{y} \leftarrow \text{Aggregation}(y, \hat{y}_{/\mathbb{B}_1}, \hat{y}_{/\mathbb{B}_2}, \ldots, \hat{y}_{/\mathbb{B}_{n-1}})$    ▷ Aggregation
6:   if $y = \hat{y}$ then
7:     break    ▷ $y = \hat{y}$ means that the algorithm already converges to a fixed (stable) point
8:   end if
9:   $y = \hat{y}$
10: end for
11: $\hat{c} \leftarrow \hat{y}$
12: return $\hat{c}$ List Decoding Procedure Various embodiments utilize a list decoding procedure to further decrease decoding error probability. For example, assume a unique decoding algorithm "decodeC" for a codeword C received via a binary-input memoryless channel W: $\{0,1\} \to W$. Without loss of generality, assume that the algorithm "decodeC" is based on the LLR vector of the channel output, where the LLR of an output symbol $x \in W$ is defined as:

$$LLR(x) := \ln\left(\frac{w(x \mid 0)}{w(x \mid 1)}\right) \quad \text{(eq. 3)}$$

Clearly, if $|LLR(x)|$ is small, then x is a noisy symbol, and if $|LLR(x)|$ is large, then x is relatively noiseless.

Definition 2. Let $s \leq r \leq m$ be integers, and let B be an s-dimensional subspace of $E := F_2^m$. A quotient code is defined as:

$$Q(m,r,B) := \{c_{/B} : c \in RM(m,r)\}$$

Lemma 1. Let $s \leq r \leq m$ be integers, and let B be an s-dimensional subspace of $E := F_2^m$. The code $Q(m, r, B)$ is the Reed-Muller code $RM(m-s, r-s)$.

It is noted that the various embodiments use of the case $s=1$ in Lemma 1, in addition to using all subspaces and adding an iterative process. Since the RPA_RM decoding function is presented above, the following discussion will be directed to the Aggregation function only, as depicted below with respect to Algorithm 2 below. It is noted that both $y_{/B_i} = (y_{/B_i}(T), T \in E/B)$ and $\hat{y}_{/B_1} = (\hat{y}_{/B_1}(T), T \in E/B)$ are indexed by the cosets $T \in E/B$, and that $[z+B]$ is used to denote the coset containing z (see line 3 of Algorithm 2).

---

Algorithm 2 Pseudo-Code: The Aggregation Function For BSC

---

Algorithm 2 The Aggregation function for BSC

Input: $y, \hat{y}_{/B_1}, \hat{y}_{/B_2} \ldots \hat{y}_{/B_{n-1}}$
Output: y
1:  Initialize (changevote(z), $z \in \{0, 1\}^m$) as an all-zero vector indexed by $z \in \{0, 1\}^m$
2:  $n \leftarrow 2^m$
3:  changevote(z) $\leftarrow \sum_{i=1}^{n-1} \mathbb{1}[y_{/B_i}([z+\mathbb{B}_i]) \neq \hat{y}_{/B_i}([z+\mathbb{B}_i])]$ for each $z \in \{0, 1\}^m$ 4:
$$y(z) \leftarrow (z) \oplus \mathbb{1}\left[\text{changevote}(z) > \frac{n-1}{2}\right] \qquad \triangleright \text{Here addition is over } \mathbb{F}_2$$

for each $z \in \{0, 1\}^m$

5:  $\hat{y} \leftarrow y$
6:  return $\hat{y}$

---

The list decoding procedure works as follows. Suppose that $y=(y_1, y_2, \ldots, y_n)$ is the output vector when sent a codeword of C over the channel W. A first step is to sort $|LLR(y_i)|$, $i \in [n]$ from small to large. Without loss of generality, assume that $|LLR(y_1)|$, $|LLR(y_2)|$, $|LLR(y_3)|$ are the three smallest components in the LLR vector, meaning that $y_1, y_2$ and $y_3$ are the three most noisy symbols in the channel outputs (taking three arbitrarily). Next, enumerate all the possible cases of the first three bits of the codeword $c=(c_1, c_2, \ldots, c_n)$: The first three bits $(c_1, c_2, c_3)$ can be any vector in $F_2^3$, so there are 8 cases in total, and for each case change the value of $LLR(y_1)$, $LLR(y_2)$, $LLR(y_3)$ according to the values of $c_1, c_2, c_3$. More precisely, set $LLR(y_i)=(-1)^{c_i} L_{max}$ for $i=1, 2, 3$, where $L_{max}$ is some large real number. In practice, various embodiments may choose $L_{max} := \max(|LLR(y_i)|, i \in [n])$ or $L_{max} := 2 \max(|LLR(y_i)|, i \in [n])$. For each of these 8 cases, various embodiments use "decodeC" to obtain a decoded codeword, which are denoted as $\widehat{c^{(1)}}, \widehat{c^{(2)}}, \ldots, \widehat{c^{(8)}}$. Finally, various embodiments calculate the posterior probability of $W^n(y | \widehat{c^{(i)}})$, $1 \leq i \leq 8$, and choose the largest one as the final decoding result; namely, various embodiments perform a maximal likelihood decoding among the 8 candidates in the list.

Binary Symmetric Channels (BSC) Decoding Procedure

This section begins with the definition of the quotient code., and the illustrates how the quotient code of an RM code is also an RM code.

From line 3, it may be seen that the maximal possible value of changevote(z) for each $Z \in E$ is $n-1$. Therefore the condition changevote $$(z) > \frac{n-1}{2}$$

on line 4 can be viewed as a majority vote. As discussed below, this algorithm may be viewed as one step of a power iteration method to find the eigenvector of a matrix built from the quotient code decoding.

It is noted that Algorithms 1 and 2 are depicted as pseudo codes in a mathematical fashion for the ease of understanding. These pseudo-codes may be implemented as hardware or a combination of hardware and software using almost any programming language as known by those skilled in the art.

Proposition 1. The complexity of Algorithm 1 is $O(n^r \log n)$ in sequential implementation and $O(n^2)$ in parallel implementation with $O(n^r)$ processors.

Proposition 2. Whether Algorithm 1 outputs the correct codeword or not is independent of the transmitted codeword and only depends on the error pattern imposed by the BSC channel. Specifically, let $c \in RM(m, r)$ be a codeword of the RM code, and let $e=(e(z), z \in E)$ be the error vector imposed on c by the BSC channel. The output vector of the BSC channel is $y=c+e$. Denote the decoding result as $\hat{c}=RPA\_RM(y, m, r, N_{max})$. Then the indicator function of decoding error $\mathbb{1}[\hat{c} \neq c]$ is independent of the choice of c and only depends on the error vector e. It is noted that this proposition is useful for simulations in that a transmission of an all-zero codeword over the BSC channel may be used to measure the decoding error probability.

Algorithm 2 may be viewed as a one-step power iteration of a spectral algorithm. More precisely, it is observed that: $\widehat{y_{/B_1}}$, $\widehat{y_{/B_2}}$, ..., $\widehat{y_{/B_{n-1}}}$ contain the estimates of $c(z) \oplus c(z')$ for all $z \neq z'$, where $c=(c(z), z \in E)$ is the transmitted (true) codeword. The estimate of $c(z) \oplus c(z')$ is denoted as $\widehat{y_{z,z'}}$.

As an example, to find a vector $\hat{y}=(\hat{y}(z), z \in E)$ $E\{0,1\}^n$ to agree with as many estimates of these sums as possible is finding a vector $\hat{y}$ to maximize the following:

$$|\{(z,z'): z \neq z', \hat{y}(z) \oplus \hat{y}(z') = \widehat{y_{z,z'}}\}|$$

It is noted that:

$$|\{(z,z'): z \neq z', \hat{y}(z) \oplus \hat{y}(z') = \widehat{y_{z,z'}}\}| + |\{(z,z'): z \neq z', \hat{y}(z) \oplus \hat{y}(z') \neq \widehat{y_{z,z'}}\}| = n(n-1)$$

Therefore:

$$\sum_{z \neq z'} (-1)^{\hat{y}(z)+\hat{y}(z')+\widehat{y_{z,z'}}} = 2|\{(z,z'): z \neq z', \hat{y}(z) \oplus \hat{y}(z') = \widehat{y_{z,z'}}\}| - n(n-1)$$

Thus the task is to find:

$$\mathrm{argmax}_{\hat{y} \in \{0,1\}^n} \sum_{z \neq z'} (-1)^{\hat{y}(z)+\hat{y}(z')+\widehat{y_{z,z'}}} \quad \text{(eq. 4)}$$

Given a vector $\hat{y} \in \{0,1\}^n$, we define another vector $\hat{u} \in \{-1,1\}^n$ by setting $\hat{u}(z):=(-1)^{\hat{y}(z)}$ for all $z \in E$. In order to find the maximizing vector $\hat{y}$ in (eq. 6), it suffices to find $$\mathrm{argmax}_{u \in \{-1,1\}^n} \sum_{z \neq z'} (-1)^{\widehat{y_{z,z'}}} u(z) u(z') \quad \text{(eq. 5)}$$

Now an n×n matrix A is built from $\{\widehat{y_{z,z'}} : z, z' \in E, z \neq z'\}$ as follows: The rows and columns of A are indexed by $z \in E$, and the following entry is set:

$$A_{z,z'} := \begin{cases} (-1)^{\widehat{y_{z,z'}}} & \text{if } z \neq z' \\ 0 & \text{if } z = z' \end{cases}$$

That is, for $z \neq z'$ there is set $A_{z,z'}=1$ if $\widehat{y_{z,z'}}=0$, and $A_{z,z'}=-1$ if $\widehat{y_{z,z'}}=1$. Under this definition, the optimization problem (eq. 5) becomes:

$$\mathrm{argmax}_{\hat{u} \in \{-1,1\}^n} \sum_{z \neq z'} \hat{u}(z)\hat{u}(z') = \mathrm{argmax}_{\hat{u} \in \{-1,1\}^n} \hat{u}^T A \hat{u} \quad \text{(eq. 6)}$$

It is well known that this combinatorial optimization problem is NP-hard. In practice, a reasonable approach is to use the following spectral relaxation to obtain approximate solution:

$$\mathrm{argmax}_{\hat{u} \in R^n, |\hat{u}|^2 = n} \hat{u}^T A \hat{u}$$

A solution to this relaxed optimization problem is the eigenvector corresponding to the largest eigenvalue of A. One way to find this eigenvector is to use the power iteration method: that is, pick some vector v (e.g., at random), then $A^t v$ converges to this eigenvector when t is large enough. After resealing $A^t v$ to make $|A^t v|^2 = n$, obtain the maximizing vector $\tilde{u}=A^t v$ in the relaxed optimization problem. In order to obtain the solution to the original optimization problem in (eq. 6), the embodiments only need to look at the sign of each coordinate of $\tilde{u}$: If $\tilde{u}(z)>0$, then set $\hat{u}(z)=1$, and if $\tilde{u}(z)<0$, then set $\hat{u}(z)=-1$. In this manner, the vector $\hat{u}$ that serves as an approximate solution to (eq. 6) is obtained. To summarize, an approximate solution to (eq. 6) is $\hat{u}=\mathrm{sign}(A^t v)$, where v is some random vector and t is some large enough integer.

Denoting the output vector of Algorithm 2 as $\bar{y}$, and defining another vector $\bar{u}$ as $\bar{u}(z)=(-1)^{\bar{y}(z)}$ for all $z \in E$. For the original received vector y, also defined is a vector u as $u(z)=(-1)^{y(z)}$ for all $z \in E$. An important observation in this section is that:

$$\bar{u}=\mathrm{sign}(Au) \quad \text{(eq. 7)}$$

That is, the output of Algorithm 2 is in fact the same as a one-step power iteration of the spectral algorithm with the original received vector u playing the role of vector v above. It is also easy to see why (eq. 7) holds: According to (eq. 7), $\bar{u}(z)=1$ if $E_{z' \neq z}(-1)^{\widehat{y_{z,z'}} \oplus y(z')} > 0$ and $\bar{u}(z)=-1$ otherwise. This is equivalent to saying that $$\bar{y}(z) = 0 \text{ if } |\{z': z' \neq z, \widehat{y_{z,z'}} \oplus y(z') = 0\}| > \frac{n-1}{2}$$

and $\bar{u}(z)=1$ otherwise. The vector $\bar{y}$ given by this rule is exactly the same as the output vector of Algorithm 2.

General Binary-Input Memoryless Channel Decoding Procedure

The decoding algorithm is directed to BSC, whereas this section will present an extension of Algorithm 1 that is suitable for use in decoding any binary-input memoryless channels and is based on LLRs (see (eq. 3) above). Similarly to Algorithm 1, the general algorithm is also defined recursively in that it we first assumes knowledge for decoding the (r−1)-th order Reed-Muller code, after which it may be used to decode the r-th order Reed-Muller code. It is noted that a soft-decision FHT decoder may be used to allow for the decoding of the first order RM code efficiently for general binary-input channels. The soft-decision FHT decoder may be based on LLR, and the complexity is also O(n log n), as with as the hard-decision FHT decoder.

An FHT decoder for first order RM codes may be used. Specifically, various embodiments use $c=(c(z), z \in E)$ to denote the transmitted (true) codeword and $y=(y(z), z \in E)$ to denote the corresponding channel output. Given the output vector y, the ML decoder for first order RM codes aims to find $c \in RM(m,1)$ to maximize $\prod_{z \in E} W(y(z)|c(z))$. This is equivalent to maximizing the following quantity:

$$\prod_{z \in E} \frac{W(y(z)|c(z))}{\sqrt{Q(y(z)|0)w(y(z)|1)}}$$

which is further equivalent to maximizing:

$$\sum_{z \in E} \ln\left(\frac{w(y(z)|c(z))}{\sqrt{w(y(z)|0)w(y(z)|1)}}\right) \quad \text{(eq. 8)}$$

It is noted that codeword c is a binary vector. Therefore:

$$\ln\left(\frac{W(y(z)|c(z))}{\sqrt{W(y(z)|0)W(y(z)|1)}}\right) = \begin{cases} \frac{1}{2} LLR(y(z)) & \text{if } c(z) = 0 \\ -\frac{1}{2} LLR(y(z)) & \text{if } c(z) = 1 \end{cases}.$$

where the shorthand notation may be expressed as:

$$L(z) := LLR(y(z)),$$

and the formula in (eq. 8) may be written as:

$$\frac{1}{2}\sum_{z \in E}((-1)^{c(z)}L(z)),\qquad \text{(eq. 9)}$$

such that the goal is to find $c \in RM(m, 1)$ to maximize this quantity.

Every $c \in RM(m, 1)$ corresponds to a polynomial in $F_2[Z_1, Z_2, \ldots, Z_m]$ of degree one, so every codeword c may be expressed as a polynomial $u_0 + \sum_{i=1}^{m} u_i Z_i$. In this manner, therefore $c(z) = u_0 + \sum_{i=1}^{m} u_i z_i$, where $z_1, z_2, \ldots, z_m$ are the coordinates of the vector z. The task then becomes finding $u_0, u_1, u_2, \ldots, u_m \in F_2$ to maximize the following:

$$\sum_{z \in E}\left((-1)^{u_0 + \sum_{i=1}^{m} u_i z_i} L(z)\right) = (-1)^{u_0} \sum_{z \in E}\left((-1)^{\sum_{i=1}^{m} u_i z_i} L(z)\right) \qquad \text{(eq. 10)}$$

For a binary vector $u = (u_1, u_2, \ldots, u_m) \in E$, the following is defined:

$$\hat{L}(u) := \sum_{z \in E}\left((-1)^{\sum_{i=1}^{m} u_i z_i} L(z)\right).$$

To find the maximizer of (eq. 10), a calculation may be made of $\hat{L}(u)$ for all $u \in E$. Since the vector $(\hat{L}(u), u \in E)$ is exactly the Hadamard Transform of the vector $(L(z), z \in E)$, this calculation may be made using the Fast Hadamard Transform with complexity $O(n \log n)$. Once the values of $(\hat{L}(u), u \in E)$ are known, a value $u^* = (u^*_1, u^*_2, \ldots, u^*_m) \in E$ that maximizes $|\hat{L}(u)|$ may be found. If $\hat{L}(u^*) > 0$, then the decoder outputs the codeword c corresponding to $u^*_0 = 0$, $u^*_1, u^*_2, \ldots, u^*_m$. Otherwise, the decoder outputs the codeword c corresponding to $u^*_0 = 1$, $u^*_1, u^*_2, \ldots, u^*_m$. Thus, various embodiments decode first order RM codes for general channels in this manner.

The next problem is how to extend (eq. 2) in a general setting. The purpose of (eq. 2) is mapping two output symbols (y(z), z∈T) whose indices are in the same coset T∈E/B to one symbol. This reduces the r-th order RM code to an r-1-th order RM code. For BSC, this mapping is simply the addition in $F_2$. The sum $y_{/B}(T)$ may be interpreted as an estimate of $c_{/B}(T)$, where c is the transmitted (true) codeword. In other words:

$$\mathbb{P}(Y_{/B}(T) = c_{/B}(T)) > \mathbb{P}(Y_{/B}(T) = c_{/B}(T) \oplus 1)$$

where Y is the channel output random vector.

For general channels, a desired estimate of $c_{/B}(T)$ is based on the LLRs $(L(z), z \in T)$. More precisely, given $(y(z), z \in T)$, or equivalently given $(L(z), z \in T)$, it is desired to calculate the following LLR:

$$L_{/B}(T) := \ln\left(\frac{P(Y(z) = y(z), z \in T \mid c_{/B}(T) = 0)}{P(Y(z) = y(z), z \in T \mid c_{/B}(T) = 1)}\right)$$

where Y is the channel output random vector.

Lemma 2. Suppose that $r \geq 1$. Let C be a random codeword chosen uniformly from RM(m, r), and let z and z' be two distinct vectors in E. Then the two coordinates (C(z), C(z')) of the random codeword C have i.i.d. Bernoulli-$1/2$ distribution.

By way of proof of Lemma 2, first define the following four sets:

A(0,0) := {c∈RM(m, r): c(z)=c(z')=0},
A(0,1) := {c∈RM(m, r): c(z)=0, c(z')=1},
A(1,0) := {c∈RM(m, r): c(z)=1, c(z')=0},
A(1,1) := {c∈RM(m, r): c({z})=c({z}')=1}.

To prove this lemma, it is only necessary to show that |A(0,0)|=|A(0,1)|=|A(1,0)|=|A(1,1)|. Since RM code is linear and the all one vector is a codeword of RM codes, the marginal distribution of the coordinate C(z) is Bernoulli-1/2 for every z∈E. Thus providing the following:

|A(0,0)|+|A(0,1)|=|A(1,0)|+|A(1,1)|,

|A(0,0)|+|A(1,0)|=|A(0,1)|+|A(1,1)|. (eq. 11)

Taking $z = (z_1, \ldots, z_m)$ and $z' = (z'_1, \ldots, z'_m)$ such that $z \neq z'$, there exists $i \in [m]$ such that $z_i \neq z'_i$. Since it is assumed that $r \geq 1$, RM(m, r) contains the evaluation vector of the degree-1 monomial $Z_i$, evaluation vector is denoted as v, and it is known that $v(z) \neq v(z')$. Without loss of generality, it is assumes that $v(z)=0$ and $v(z')=1$. Then (given that for a set A and a vector v there is defined a set A+v := {a+v: a∈A}), it may be stated that A(0,0)+v⊆A(0,1), such that |A(0,0)|≤|A(0,1)|. Conversely, it may also be stated that A(0,1)+v⊆A(0,0), such that |A(0,1)|≤|A(0,0)|. Therefore, |A(0,1)|=|A(0,0)|. Similarly, it can be shown that |A(1,1)|=|A(1,0)|. Taking these into (eq. 11) the following is obtained: |A(0,0)|=|A(0,1)|=|A(1,0)|=|A(1,1)|, which completes the proof of Lemma 2.

$L_{/B}(T)$ may now be calculated using the following model: Assume that $S_1$ and $S_2$ are i.i.d. Bernoulli-1/2 random variables, and transmitted over two independent copies of the channel W: $\{0,1\} \to W$. The corresponding channel output random variables are denoted as $X_1$ and $X_2$, respectively. Then for $x_1, x_2 \in W$, $$\ln\left(\frac{\mathbb{P}(X_1 = x_1, X_2 = x_2 \mid S_1 + S_2 = 0)}{\mathbb{P}(X_1 = x_1, X_2 = x_2 \mid S_1 + S_2 = 1)}\right) =$$

$$\ln\left(\frac{\mathbb{P}(X_1 = x_1, X_2 = x_2, S_1 + S_2 = 0)}{\mathbb{P}(X_1 = x_1, X_2 = x_2, S_1 + S_2 = 1)}\right) =$$

$$\ln\left(\frac{\mathbb{P}(X_1 = x_1, X_2 = x_2, S_1 = 0, S_2 = 0) +}{\mathbb{P}(X_1 = x_1, X_2 = x_2, S_1 = 1, S_2 = 1)}\right) =$$
$$\ln\left(\frac{\mathbb{P}(X_1 = x_1, X_2 = x_2, S_1 = 0, S_2 = 1) +}{\mathbb{P}(X_1 = x_1, X_2 = x_2, S_1 = 1, S_2 = 0)}\right)$$

$$\ln\left(\frac{\frac{1}{4}W(x_1 \mid 0)W(x_2 \mid 0) + \frac{1}{4}W(x_1 \mid 1)W(x_2 \mid 1)}{\frac{1}{4}W(x_1 \mid 0)W(x_2 \mid 1) + \frac{1}{4}W(x_1 \mid 1)W(x_2 \mid 0)}\right) =$$

$$\ln\left(\frac{\frac{W(x_1 \mid 0)W(x_2 \mid 0)}{W(x_1 \mid 1)W(x_2 \mid 1)} + 1}{\frac{W(x_1 \mid 0)}{W(x_1 \mid 1)} + \frac{W(x_2 \mid 0)}{W(x_2 \mid 1)}}\right) = \ln(\exp(LLR(x_1) + LLR(x_2)) + 1) -$$

$$\ln(\exp(LLR(x_1)) + \exp(LLR(x_2))).$$

Lemma 2 above allows the replacement of $x_1, x_2$ with $(y(z), z \in T)$, such that the following is obtained:

$$L_{/B}(T) = \ln\left(\exp\left(\sum_{z \in T} L(z)\right) + 1\right) - \ln\left(\sum_{z \in T} \exp(L(z))\right). \qquad \text{(eq. 12)}$$

The following is a decoding algorithm for general binary-input channels according to an embodiment. Specifically, in Algorithms 3 and 4 (below), the decoding result of the (r−1)-th order RM code is denoted as $\widehat{y_{/B}}$ (e.g., see line 7 of Algorithm 3), where $\widehat{y_{/B}} = (\widehat{y_{/B}}(T), T \in E/B)$ are indexed by the cosets $T \in E/B$, and $[z+B]$ is used to denote the coset containing z (e.g., see line 3 of Algorithm 4).

Algorithm 3 is similar to Algorithm 1: From line 8 to line 10 there is a comparison of $\hat{L}(z)$ with the original L(z). If the relative difference between these two is below the threshold θ for every $z \in E$, then the values of $L(z), z \in E$ change very little in the instant iteration, and the algorithm reaches a "stable" state, such that it exits the for-loop on line 2. Various embodiments use θ=0.05 and we a maximal number of iterations $N_{max}$=m/2, which is the same as in Algorithm 1. It is noted that greater or lesser values may be selected for use in different embodiments. The inventors note that the decoding error probability is non-increasing when decreasing the value of θ, and the running time of the algorithm increases when decreasing θ. Simulations provide that the decoding error probability remains the same if continued decreasing of θ beyond 0.05, therefore θ=0.05 is a reasonable choice in many embodiments since a smaller θ will only increase the running time while not appreciably decreasing decoding error. On line 13, the algorithm simply produces the decoding result according to the LLR at each coordinate.

With respect to Algorithm 4, at line 3 the algorithm sets cumuLLR(z)=$\Sigma_{z' \neq z} \alpha(z,z') L(z')$, where the coefficients $\alpha(z, z')$ can only be 1 or −1. More precisely, $\alpha(z, z')$ is 1 if the decoding result of the corresponding (r−1)-th order RM code at the coset $\{z, z'\}$ is 0, and $\alpha(z,z')$ is −1 if the decoding result at the coset $\{z, z'\}$ is 1. Thus, the decoding result at the coset $\{z, z'\}$ is an estimate of $c(z) \oplus c(z')$. If $c(z) \oplus c(z')$ is more likely to be 0, then the sign of L(z) and L(z') should be the same. Here cumuLLR(z) serves as an estimate of L(z) based on all the other L(z'), z'≠z, so we assign the coefficient $\alpha(z, z')$ to be 1. Otherwise, if $c(z) \oplus (z')$ is more likely to be 1, then the sign of L(z) and L(z') should be different, so assign the coefficient $\alpha(z, z')$ to be −1.

It is noted that Algorithms 3 and 4 are depicted as pseudo codes in a mathematical fashion for the ease of understanding. These pseudo-codes may be implemented as hardware or a combination of hardware and software using almost any programming language as known by those skilled in the art.

Proposition 3. The complexity of Algorithm 3 is $O(n^r \log n)$ in sequential implementation and $O(n^2)$ in parallel implementation with $O(n^r)$ processors. It is also noted that the decoding error probability of Algorithm 3 is independent of the transmitted codeword for binary-input memoryless symmetric (BMS) channels. In various embodiments, the complexity is reduced by one or more of: jumping layers, taking larger subspaces, taking only a subset of projections, or combining the projections with other decompositions such as a Plotkin decomposition.

---

Algorithm 3 Pseudo-Code: The RPA_RM Decoding
Function For General Binary-Input Memoryless Channels
Algorithm 3 The RPA_RM decoding function for general binary-input memoryless channels

---

Input: The LLR vector (L(z), z ∈ $\{0, 1\}^m$); the parameters of the Reed-Muller code m and r;
the maximal number of iterations $N_{max}$; the exiting threshold θ
Output: The decoded codeword ĉ
1:  $\mathbb{E} := \{0, 1\}^m$
2:  for j = 1, 2, . . . , $N_{max}$ do
3:    $L\mathbb{B}_i \leftarrow (L\mathbb{B}_i(T), T \in E\mathbb{B}_i)$ for i = 1, 2, . . . , $2^m - 1$     ▷ Projection
4:      ▷ $L\mathbb{B}_i(T)$ is calculated from (L(z), z ∈ $\mathbb{E}$) according to (7)
5:    $\hat{y}_{/\mathbb{B}_i} \leftarrow$ RPA_RM($L\mathbb{B}_i$, m − 1, r − 1, $N_{max}$, θ) for i = 1, 2, . . . , $2^m - 1$   ▷ Recursive decoding
6:    ▷ If r = 2, then we use the Fast Hadamard Transform to decode the first-order RM code
7:    $\hat{L} \leftarrow$ Aggregation(L, $\hat{y}_{/\mathbb{B}_1}, \hat{y}_{/\mathbb{B}_2}, \ldots, \hat{y}_{/\mathbb{B}_{n-1}}$)   ▷ Aggregation
8:    if $|\hat{L}(z) - L(z)| \leq \theta |L(z)|$ for all z ∈ $\mathbb{E}$ then   ▷ The algorithm reaches a stable point
9:      break
10:   end if
11:   $L \leftarrow \hat{L}$
12: end for
13: $\hat{c}(z) \leftarrow \mathbb{1}[L(z) < 0]$ for each z ∈ $\mathbb{E}$
14: return ĉ

---

Algorithm 4 Pseudo-Code: The Aggregation Function For General Binary-Input
Memoryless Channels

---

Algorithm 4 The Aggregation function for general binary-input memoryless channels
Input: L, $\hat{y}_{/B_1}, \hat{y}_{/B_2}, \ldots, \hat{y}_{/B_{n-1}}$
Output: $\hat{L}$
1:  Initialize (cumuLLR(z), z ∈ $\{0, 1\}^m$) as an all-zero vector indexed by z ∈ $\{0, 1\}^m$
2:  n ← $2^m$
3:  cumuLLR(z) ← $\Sigma_{i=1}^{n-1} ((1 - 2\hat{y}_{/B_i}([z + \mathbb{B}_i])) L(z \oplus z_i))$ for each z ∈ $\{0, 1\}^m$
4:    ▷ $z_i$ is the nonzero element in $\mathbb{B}_i$
5:    ▷ $\hat{y}_{/B_i}$ is the decoded codeword, so $\hat{y}_{/B_i}([z + \mathbb{B}_i])$ is either 0 or 1
6:  $\hat{L}(z) \leftarrow \dfrac{cumuLLR(z)}{n - 1}$ for each z ∈ $\{0, 1\}^m$
7:  return $\hat{L}$ Proposition 4. The decoding error probability of Algorithm 3 is independent of the transmitted codeword for binary-input memoryless symmetric (BMS) channels.

Definition 3. A memoryless channel W: $\{0,1\} \to W$ is a BMS channel if there is a permutation $\pi$ of the output alphabet W such that $\pi\hat{}\{-1\}=\pi\$$ and $\$W(x|1)=W(\pi(x)|0)$ for all $x \in W$.

Proposition 4. Let W: $\{0,1\} \to W$ be a BMS channel. Let $c_1$ and $c_2$ be two codewords of RM(m, r). Let $Y_1$ and $Y_2$ be the (random) channel outputs of transmitting $c_1$ and $c_2$ over $n=2^m$ independent copies of W, respectively. Let $L^{(1)}$ and $L^{(2)}$ be the LLR vectors corresponding to $Y_1$ and $Y_2$, respectively (it is noted that $Y_1$ and $Y_2$ are random vectors, that the randomness comes from the channel noise and, as a result, $L^{(1)}$ and $L^{(2)}$ are also random vectors). Then for any $c_1$, $c_2 \in RM(m, r)$, it can be stated that:

$$-P(\text{RPA\_RM}(L^{(1)}, m, r, N_{max}, \theta) \neq c_1) = P(\text{RPA\_RM}(L^{(2)}, m, r, N_{max}, \theta) \neq c_2).$$

It is noted that this proposition is useful for simulations in that a transmission of an all-zero codeword over the BMS channel W may be used to measure the decoding error probability.

The above description presents a list decoding version of the RPA_RM function. Since the main concept has been described above with respect to the other Propositions, what is provided herein below will be directed toward the pseudo code of the list decoding version. It is noted that the purpose of line 8 of Algorithm 5 is to make sure that $\widehat{c^{(u)}}$ is a codeword of RM code, which is not always true for the decoding result of the RPA_RM function.

Finally, we present the following proposition on the memory requirement for sequential implementation of RPA decoder. A remarkable thing here is that the memory requirement for the list decoding version of RPA algorithm is 5n, which is independent of the list size, in contrast to, for example, an SCL decoder of polar codes.

Proposition 5. The memory needed for sequential implementation of the RPA decoder without list decoding is no more than 4n, and the memory needed for sequential implementation of the RPA decoder with list decoding is no more than 5n, where n is the code length. Note that the memory requirement for list decoding version does not depend on the list size.

As noted above, Algorithm 3 is written in compact fashion for the ease of understanding, but it is not space-efficient in practical implementation. A more robust algorithm is provided below as Algorithm 9, upon which various analysis of space complexity provided herein is generally based.

The most important difference between Algorithm 3 and Algorithm 9 is that in Algorithm 3 contemplates finishing of all the recursive decoding first, and then performing the aggregation step. By contrast, in Algorithm 9 the recursive decoding step and the aggregation step are interleaved together such that a significant amount of memory is conserved as compared to Algorithm 3.

A proof may start with an RPA decoder without list decoding, and may then prove by induction on r, the order of the RM code. For the base case of r=1, the claim clearly holds. Now assume that the claim holds for all RM codes with order <r and prove it for order r. In Algorithm 9, there is needed n floating number positions to store the LLR vector and another n floating number positions to store the cumuLLR vector. Then the codewords are projected onto the cosets of each one-dimensional subspace sequentially. For each projected codeword, there is a need to decode a RM code with length n/2 and order r−1. By induction hypothesis, this takes 4*n/2=2n floating number positions. Therefore in total there is needed n+n+2n=4n floating number positions. This establishes the inductive step and completes the proof for the non-list-decoding version.

The memory requirement for list decoding version follows directly from that of initial embodiments described above: Since list decoding is performed sequentially (i.e., only decode one list at a time), the only extra memory needed in the list decoding version is the n floating number positions that are used to store a currently best known decoding result. Therefore, the space complexity for the list decoding version is 5n.

Simplified RPA Algorithm For High Rate RM Codes

This section provide some simplified versions of the RPA decoder, which significantly accelerate the decoding process while maintaining the same (nearly optimal) decoding error probability for certain RM codes with rate >0.5.

As previously discussed, the decoding algorithm may be accelerated by using fewer subspaces in the projection step. Moreover, instead of using one-dimensional subspaces, various embodiments use a selected subsets of two-dimensional subspaces in the projection step. In particular, various embodiments only project onto the $$\binom{m}{2}$$

two-dimensional subspaces spanned by two standard basis vectors of E. The standard basis vector of E are $e^{(1)}, \ldots, e^{(m)}$, where $e^{(i)}$ is defined as the vector with 1 in the i-th position and 0 everywhere else. Then the $$\binom{m}{2}$$

two-dimensional subspaces may be written as $\{B_{i,j}: 1 \leq i < j \leq m\}$, where:

$$B_{i,j} := \text{span}(e^{(i)}, e^{(j)})$$

---

Algorithm 5 Pseudo-Code: The RPA_LIST Decoding
Function For General Binary-Input Memoryless Channels Input: The LLR vector (L(z), $z \in \{0, 1\}^m$); the parameters of the Reed-Muller code m and r;
the maximal number of iterations $N_{max}$; the exiting threshold $\theta$: the list size $2^t$
Output: The decoded codeword $\hat{c}$
1: $\tilde{L} \leftarrow L$
2: $(z_1, z_2, \ldots, z_t) \leftarrow$ indices of the t smallest entries in $(|L(z)|, z \in \{0,1\}^m)$
3: $\triangleright z_i \in \{0, 1\}^m$ for all i = 1, 2, ..., t
4: $L_{max} \leftarrow 2 \max(|L(z)|, z \in \{0, 1\}^m)$
5: for each $u \in \{L_{max}, -L_{max}\}^t$ do
6: $\quad (L(z_1), L(z_2), \ldots, L(z_t)) \leftarrow u$ Algorithm 5 Pseudo-Code: The RPA_LIST Decoding
Function For General Binary-Input Memoryless Channels

```
 7:    ĉ^(u) ← RPA_RM(L, m, r, N_max, θ)
 8:    ĉ^(u) ← Reedsdecoder (ĉ^(u))      ▷ Reedsdecoder is the classical decoding algorithm in [1]
 9:   end for
10:   u* ← argmax_u Σ_{z∈{0,1}^m} ((-1)^{ĉ^(u)(z)} L(Lz))
11:                                      ▷ This follows from (5), Maximization is over u ∈ {L_max, - L_max}^t
12:   ĉ ← ĉ(u*)
13:   return ĉ
```

It is noted that projection onto cosets of two-dimensional subspaces is different from onto that of one-dimensional subspaces: In the one-dimensional case, each coset only contains two coordinates, and the embodiment only needs to combine the LLR of two coordinates to obtain the LLR of the coset, as per (eq. 12). In the two-dimensional case, each coset contains four coordinates, and the embodiment needs to combine the LLR of four coordinates to obtain the LLR of the coset. Fortunately, the embodiment can use exactly the same idea as in the proof of Lemma 2 (above) to show that any four coordinates in a coset of a two-dimensional subspace are also independent. Therefore, the following counterpart of (eq. 12) may be obtained for a coset T of two-dimensional subspace assuming that $$T = \{z^{(1)}, z^{(2)}, z^{(3)}, z^{(4)}\}: \quad \text{(eq. 13)}$$

$$L_{/B}(T) = \ln\left(\exp\left(\sum_{i=1}^{4} L(z^{(i)})\right) + \sum_{1 \le i < j \le 4} \exp(L(z^{(i)}) + L(z^{(j)})) + 1\right) - \ln\left(\sum_{i=1}^{4} \exp(L(z^{(i)})) + \sum_{i=1}^{4} \exp\left(\sum_{j \in [4] \setminus \{i\}} L(z^{(j)})\right)\right).$$

After projecting RM(m, r) onto the cosets of these two-dimensional subspaces, there is obtained RM codes with parameters m−2 and r−2, as proved in Lemma 1. After decoding these $\binom{m}{2}$ projected codes RM(m−2,r−2), there is obtained $\{\widehat{y_{/B_{i,j}}} : 1 \le i < j \le m\}$, where $\widehat{y_{/B_{i,j}}} = \widehat{y_{/B_{i,j}}}(T), T \in E/B_{i,j})$. The procedure then moves to the aggregation step using both the recursive decoding result $\{\widehat{y_{/B_{i,j}}} : 1 \le i < j \le m\}$ and the original LLR vector L. In particular, when decoding c(z), the relevant coordinate in $\widehat{y_{/B_{i,j}}}$ is $\widehat{y_{/B_{i,j}}}([z+B_{i,j}])$, where $[z+B_{i,j}]$ is the coset of $B_{i,j}$ that contains z. Now suppose that the other three vectors in $[z+B_{i,j}]$ apart from z itself are $z^{(1)}, z^{(2)}, z^{(3)}$. Then from $\widehat{y_{/B_{i,j}}}([z+B_{i,j}])$ and $L(z^{(1)}), L(z^{(2)}), L(z^{(3)})$, is obtained the following estimate of the LLR of c(z):

$$L_{/B}(T) = \ln\left(\exp\left(\sum_{i=1}^{4} L(z^{(i)})\right) + \sum_{1 \le i < j \le 4} \exp(L(z^{(i)}) + L(z^{(j)})) + 1\right) - \ln\left(\sum_{i=1}^{4} \exp(L(z^{(i)})) + \sum_{i=1}^{4} \exp\left(\sum_{j \in [4] \setminus \{i\}} L(z^{(j)})\right)\right). \quad \text{(eq. 14)}$$

Algorithm 6 Pseudo-Code: A Simplified RPA Decoding Function

Input: The LLR vector (L(z), z ∈ {0, 1}^m); the parameters of the Reed-Muller code m and r;
the maximal number of iterations N_max; the exiting threshold θ
Output: The decoded codeword ĉ

```
 1:  𝔼 := {0, 1}^m
 2:  for j = 1, 2, . . . , N_max do
 3:      L_{/B_{i,j}} ← L_{/B_{i,j}}(T), (T) ∈ E𝔹_{i,j})  for 1 ≤ i < j ≤ m         ▷ Projection
 4:                                                   ▷ L_{/B_{i,j}}(T) is calculated according to (13)
 5:      û_{/𝔹_{i,j}} ← Simplified_RPA(L_{/B_{i,j}}, m − 2, r − 2, N_max, θ) for 1 ≤ i < j ≤ m
 6:                                                                              ▷ Recursive decoding
 7:          ▷ If r = 3, then we use the Fast Hadamard Transform to decode the first-order RM code
 8:          ▷ If r = 4, then we use the normal RPA algorithm to decode the second-order RM code
 9:      Ĺ ← Simp_Aggregation(L_1, {ŷ𝔹_{i,j} : 1 ≤ i < j ≤ m})                  ▷ Aggregation
10:      if |Ĺ(z) − L(z)| ≤ θ|L(z)| for all z ∈ 𝔼 then   ▷ The algorithm reaches a stable point
11:          break
12:      end if
13:      L ← Ĺ
14:  end for
15:  ĉ(z) ← 𝟙[L(z) < 0] for each z ∈ 𝔼
16:  return ĉ
```

---
Algorithm 7 Pseudo-Code: A Simplified_Aggregation
Function In The Simplified_RPA Algorithm
---

Input: $L$, $\{y_{i,j} : 1 \leq i < j \leq m\}$
Output: $\hat{L}$
1:    Calculate $Est_{i,j}(z)$ from $L$ and $\{y_{i,j} : 1 \leq i < j \leq m\}$ according to (14)

2:
$$L(z) \leftarrow \frac{1}{\binom{m}{2}} \sum_{1 \leq i < j \leq m} Est_{i,j}(z)$$

for each $z \in \{0, 1\}^m$

3:    return $\hat{L}$

---

The embodiments may calculate such an estimate for all pairs of (i, j) such that $1 \leq i < j \leq m$. Then finally we update the LLR of c(z) as the average of these $$\binom{m}{2}$$

estimates, as follows:

$$\hat{L}(z) = \frac{1}{\binom{m}{2}} \sum_{1 \leq i < i \leq m} Est_{i,j}(z).$$

Finally, as in all the previous sections, the embodiments may iterate this decoding procedure a few times for the LLR vector to converge to a stable value. Various embodiments may utilize quantization techniques to approximate these values and/or the LLRs to further improve decoder efficiency.

The decoding algorithm proposed in this section are denoted as the Simplified_RPA algorithm, rather than the normal RPA algorithm proposed in the previous section. It is noted that in the recursive decoding procedure (i.e., when decoding RM(m−2, r−2)) the embodiments may still use this simplified version of RPA algorithm instead of performing a full projection step. Since each time r is reduced by 2, if the original r is even then the procedure will not reach the first-order RM codes. In this case, the procedure uses the normal RPA decoder when it reaches the second-order RM codes.

In Algorithms 6 and 7 there is provided pseudo-codes for the Simplified_RPA algorithm. It is noted that in lines 7-8 of Algorithm 6, there is distinction made between the cases of r being even and r being odd: For even r, eventually the procedure will need to decode a second-order RM code using the normal RPA decoder, while for odd r, the procedure only needs to decode first-order RM code in the final recursive step.

As is shown herein, by applying the list decoding version of the Simplified_RPA algorithm, the various embodiments may decode RM(7,4) and RM(8,5) with list size no larger than 8 such that the decoding error probability is the same as that of ML decoder. Moreover, this version runs even faster than decoding lower rate codes such as RM(8,3).

---
Algorithm 8 Pseudo-Code: The RPA_RM Decoding Function For BSC
---

Input: The corrupted codeword $y = (y(z), z \in \{0, 1\}^m)$: the parameters of the Reed-Muller code m and r: the maximal number of iterations $N_{max}$
Output: The decoded codeword $\hat{c}$
1:    for $i = 1, 2, \ldots, N_{max}$ do
2:      Initialize (changevote(z), $z \in \{0, 1\}^m$) as an all-zero vector indexed by $z \in \{0, 1\}^m$
3:      for each non-zero $z_0 \in \{0, 1\}^m$ do
4:        Set $\mathbb{B} = \{0, z_0\}$
5:        $\hat{y}_{/\mathbb{B}} \leftarrow$ RPA_RM($y_{/\mathbb{B}}$, m − 1, r − 1, $N_{max}$)
6:        ▷ if r = 2, then we use the Fast Hadamard Transform to decode the first-order RM code[8]
7:        for each $z \in \{0, 1\}^m$ do
8:          if $y_{/B}([z + \mathbb{B}]) \neq \hat{y}_{/B}([z + \mathbb{B}])$ then
9:            changevote(z) ← changevote(z) +1      ▷ Here addition is between real numbers
10:          end if
11:        end for
12:      end for
13:      numofchange ← 0
14:      n ← $2^m$
15:      for each $z \in \{0, 1\}^m$ do
16:        if changevote(z) > $\frac{n-1}{2}$ then
17:          y(z) ← y(z) ⊕ 1      ▷ Here addition is over $\mathbb{F}_2$
18:          numofchange ← numofchange + 1      ▷ Here addition is between real numbers
19:        end if
20:      end for
21:      if numofchange = 0 then
22:        break      ▷ Exit the first for loop of this function
23:        end if
24:    end for
25:    $\hat{c} \leftarrow y$
26:    return $\hat{c}$ Algorithm 9 Pseudo-Code: The RPA_RM Decoding Function For General Binary-Input Memoryless Channels Input: The LLR vector $(L(z), z \in \{0, 1\}^m)$: the parameters of the Reed-Muller code m and r: the maximal number of iterations $N_{max}$: the exiting threshold $\theta$
Output: the decoded codeword $\hat{c} = (\hat{c}(z), z \in \{0, 1\}^m)$
1: $\mathbb{E} := \{0, 1\}^m$
2: for $i = 1, 2, \ldots, N_{max}$ do
3:    Initialize (cumuLLR(z), $z \in \mathbb{E}$) as an all-zero vector indexed by $z \in \mathbb{E}$
4:    for each non-zero $z_\theta \in \mathbb{E}$ do
5:      Set $\mathbb{B} = \{0, z_\theta\}$
6:      $L_{/\mathbb{B}} \leftarrow (L_{/\mathbb{B}}(T), T \in \mathbb{E}/\mathbb{B})$    $\triangleright$ $L_{/\mathbb{B}}(T)$ is calculated from $(L(z), z \in \mathbb{E})$ according to (12)
7:      $y_{/\mathbb{B}} \leftarrow$ RPA_RM($L_{/\mathbb{B}}$, m − 1, r − 1, $N_{max}$, $\theta$)
8:      $\triangleright$ if r = 2, then we use the Fast Hadamard Transform to decode the first-order RM code
9:      for each $z \in \mathbb{E}$ do
10:        if $y_{/\mathbb{B}}([z + \mathbb{B}]) = 0$ then
11:           cumuLLR(z) $\leftarrow$ cumuLLR(z) + $L(z \oplus z_\theta)$
12:        else                $\triangleright$ $\hat{y}_{/\mathbb{B}}$ is the decoded codeword, so $\hat{y}_{/\mathbb{B}}([z + \mathbb{B}])$ is either 0 or 1
13:           cumuLLR(z) $\leftarrow$ cumuLLR(z) − $L(z \oplus z_\theta)$
14:        end if
15:      end for
16:    end for
17:    numofchange $\leftarrow 0$
18:    $n \leftarrow 2^m$
19:    for each $z \in \mathbb{E}$ do
20:      $cumuLLR(z) \leftarrow \dfrac{cumuLLR(z)}{n-1}$
21:      if $|cumuLLR(z) - L(z)| > \theta |L(z)|$ then
22:        numofchange $\leftarrow$ numofchange + 1       $\triangleright$ Here addition is between real numbers
23:      end if
24:      $L(z) \leftarrow$ cumuLLR(z)
25:    end for
26:    if numofchange = 0 then
27:      break                                            $\triangleright$ Exit the first for loop of this function
28:    end if
29: end for
30: for each $z \in \mathbb{E}$ do
31:    if $L(z) > 0$ then
32:      $\hat{c}(z) \leftarrow 0$
33:    else
34:      $\hat{c}(z) \leftarrow 1$
35:    end if
36: end for
37: return $\hat{c}$ Parallelization and acceleration. Advantageously, the various embodiments contemplate a decoding algorithm for RM codes that naturally allows parallel implementation, whereas the SCL decoder for polar codes is not parallelizable. An important step in various embodiments for decoding a codeword of RM(r,m) is to decode the quotient space codes which are in RM(r−1, m−1) codes, which can be decoded in parallel. Such a parallel structure is enables the achieving of high throughput with low latency.

Another way to accelerate the algorithm is to use only certain "voting sets"—that is, in the projection step, a subset of one-dimensional subspaces is selected instead of all the one-dimensional subspaces. Recursive decoding is still used, followed by the aggregation step. In this manner, the various embodiments may decode fewer RM(r−1, m−1) codes while, if the voting sets are chosen properly, obtaining a similar decoding error probability with shorter running time. An example of a concrete choice of voting is discussed above with respect to Algorithm 6, which indeed accelerates the decoding of high-rate RM codes with nearly-ML decoding error probability.

Various embodiments are especially well suited to RM(8, 2) decoding since this is nearly optimal in terms of code length in the sense that the lower bound of code length is 251, which differs from the actual code length of RM codes by only 5. RM(9,2) is also close to optimal, where the lower bound on code length is 500. However, for RM codes with larger order (dimension) and larger code length, the lower bound differs from the actual code length by at least 50 such as, for example, RM(9,3) where the lower bound becomes 464.

Various embodiments make use of one-dimensional subspace reduction as discussed above. In further embodiments, changes may be made to the $B_1, \ldots, B_{n-1}$ in the RPA decoding algorithms to any of the s-dimensional subspaces, with different combinations possible. In above sections according to these embodiments the usual choice was s=2, though s=3, s=4 and the like may also be used.

Various embodiments of the RPA decoding algorithms may also be used to decode other codes that are supported on a vector space, or any code that has a well-defined notion of "code projection" that can be iteratively applied to produce eventually a "trivial" code (i.e., one that can be decoded efficiently). In the case of RM codes, the quotient space projection has the specificity of producing again RM codes, and the trivial code is the Hadamard code that can be decoded using the FHT.

Various embodiments contemplate spectral decompositions and/or other relaxations in the Aggregation step instead of majority voting. Depending on the regime used, one may take multiple iteration of the power-iteration method.

As noted herein, "Algorithm 1" and related text provides a preferred description for an exemplary BSC, while "Algorithm 3" and related text provides a preferred description for general channels. It is noted that an RM-RPA decoder is discussed at "Algorithm 3" and related text, while an RM-RPA list decoder is discussed at "Algorithm 5" and related text. Further, an RM-RPA list decoder with 1 parity is discussed at "Algorithm 8" and related text, including where the number of parities in the outer code is 1.

Figure 3:
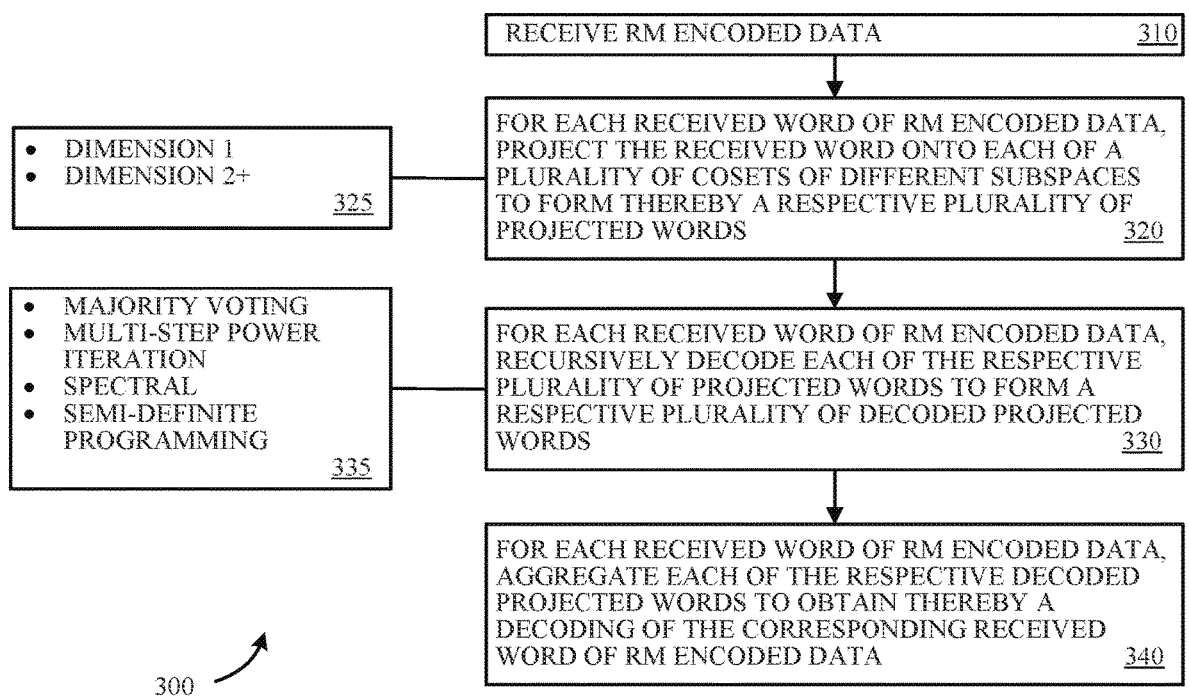
FIGS. 3-4 are flow diagrams of decoding methods according to various embodiments.

FIG. 3 is a flow diagram of a decoding method according to an embodiment. Specifically, as described in detail above and further illustrated in FIG. 3, one embodiment is a method of decoding data encoded with a Reed-Muller (RM) code in which a received word of RM encoded data is decoded in a recursive manner (step 310); the received word is projected on the cosets of different subspaces to form the projected words (step 320), each projected word is decoded recursively, and the decoding of all projected words are aggregated to obtain a decoding of the original received word.

For the projection phase of step 320, the number and the choice of the subspaces may be a tuning parameter, and a preferred embodiment may be to use subspaces of dimension 1. Dimensions of 2, 3 and so on may also be used (box 325).

For the aggregation phase of step 330, the aggregation function may be a tuning parameter, and a preferred embodiment may be to use majority voting. Multi-step power iteration methods, spectral methods, semi-definite programming methods and the like may also be used.

Generally speaking, the method 300 of FIG. 3 and the above-described algorithms contemplates that for every one-dimensional subspace, the method first obtains the corresponding projection of the original received word onto the cosets of this subspace. Then the decoding algorithm of a lower-order RM code is used to decode the projected vector for each subspace. Finally, a majority voting scheme (or other scheme) is used to aggregate the original received word as well as the decoded words from all the one-dimensional subspaces. This procedure is iterated several times until it converges to a stable point. Then this stable point is taken as the output; that is, the decoded form of the RM encoded word.

Thus, one embodiment comprises a method for decoding Reed-Muller (RM) encoded data, comprising: for each received word of RM encoded data, projecting the received word onto each of a plurality of cosets of different subspaces to form thereby a respective plurality of projected words; for each received word of RM encoded data, recursively decoding each of the respective plurality of projected words to form a respective plurality of decoded projected words; for each received word of RM encoded data, aggregating each of the respective decoded projected words to obtain thereby a decoding of the corresponding received word of RM encoded data. In some embodiments, the projecting may be performed in accordance with subspaces of dimension 1. In some embodiments, the projecting may be performed in accordance with subspaces of dimension 2 or 3. In some embodiments, the aggregation is performed in accordance with majority voting. In some embodiments, the aggregation is performed in accordance with one of a majority voting method, a multi-step power iteration method, a spectral method, and a semi-definite programming method.

Figure 4:
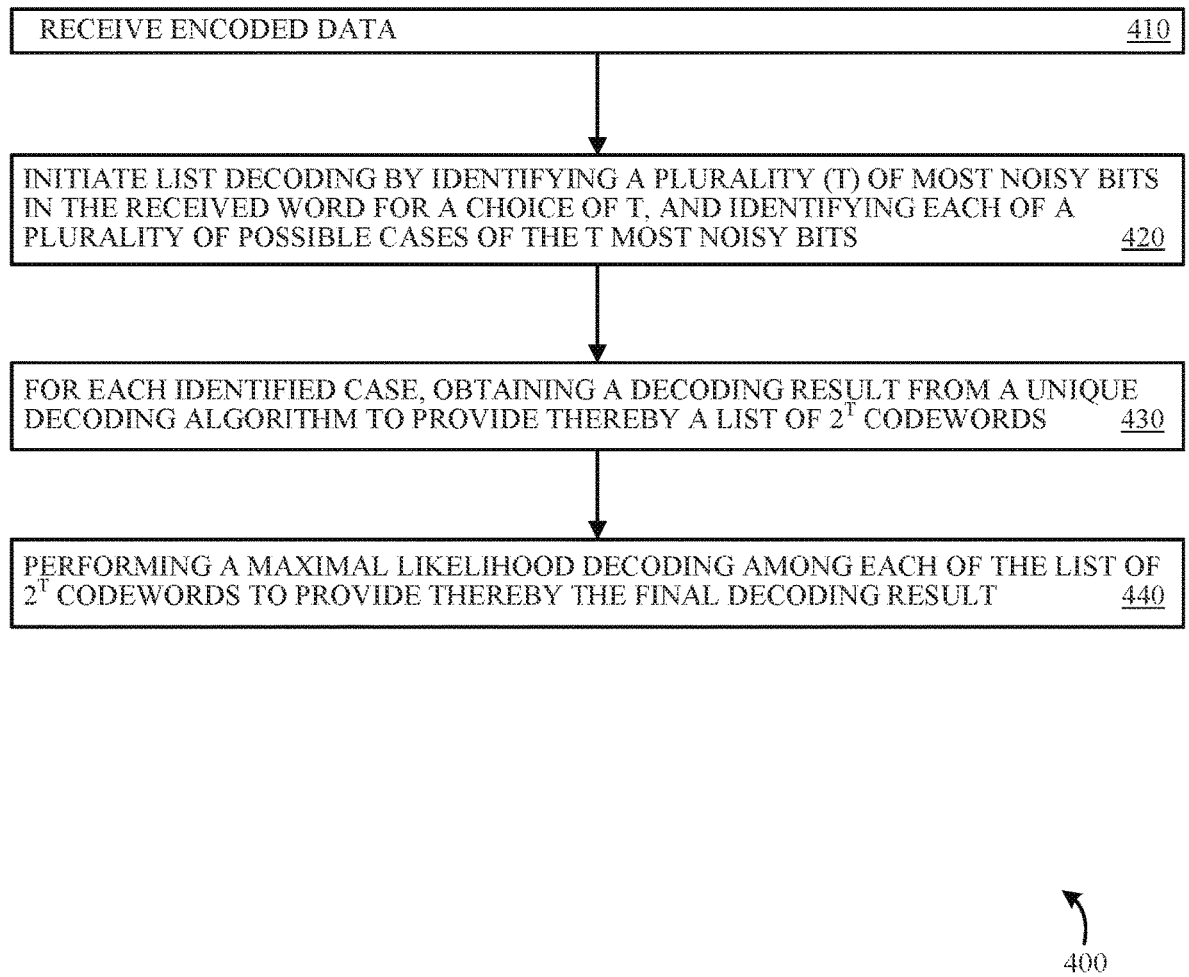

FIG. 4 is a flow diagram of a list decoding method according to an embodiment. Specifically, as described in detail above and further illustrated in FIG. 3, one embodiment is a method of decoding data encoded with a Reed-Muller (RM) code or Polar Code in which received words of encoded data are processed by identifying a plurality (t) of most noisy bits in the received word for a choice oft and identifying each of a plurality of possible cases of the t most noisy bits (step 420); wherein for each identified case, obtaining a decoding result from a unique decoding algorithm to provide thereby a list of 2t codewords (step 430); and performing a maximal likelihood decoding among each of the list of 2t codewords to provide thereby the final decoding result (step 440). In various embodiments, an outer code is used for the information bits, and said list decoding utilizes only those information bits forming a codeword of the outer code.

The recursive projection-aggregation (RPA) methodology discussed above may be further improved by using list-decoding procedures and/or code-concatenation procedures to provide combined encoder methods; namely, RPA with list-decoding, RPA with code-concatenation, and RPA with list-decoding and code-concatenation. It is noted that the combined methods provide a performance level that improves upon that of optimal polar code decoders and approaches the optimal decoding performance for RM codes. The code-concatenation method modifies RM codes themselves.

Advantageously, the RPA decoding method can be applied to a broader class of error-correcting codes supported on vector spaces or any code that supports the type of operations used in the RPA algorithm, such as BCH, Reed-Solomon or expander codes.

The list-decoding procedure and the code-concatenation method can be composed with any decoding algorithm for any error correcting codes to reduce the decoding error probability.

Parallel Processing

In various embodiments, parallel processing implementations are provided wherein multiple processors or processing threads are used to process respective RM encoded words, or respective dimensions of an RM encoded word or perform other parallel processing operations configured to speed up the decoding process.

Specifically, an advantage of the disclosed RPA decoding methodology for RM codes over the SCL decoder for polar codes is that the disclosed RPA decoding methodology naturally allows parallel implementation while the SCL decoder is simply not parallelizable. An important key step in the disclosed RPA decoding methodology for decoding a codeword of RM(r,m) is to decode the quotient space codes which are in RM(r−1,m−1) codes, and each of these quotient space codes can be decoded independently and in parallel. Such a parallel structure is crucial to achieving high throughput and low latency.

Extensions

Various embodiments contemplated by the inventors herein provide universal decoder functionality suitable for use in a wide variety of channel decoding and other applications.

It is noted that the methods, algorithms, techniques and the like for encoding, decoding and otherwise processing Reed-Muller codes, Polar codes and variations thereof discussed in the first appended document, second appended document, or discussed herein with respect to the various figures may be operably combined in part or in whole to provide various other and further embodiments and that such embodiments are contemplated by the inventors.

Various embodiments comprise systems and methods of encoding, decoding and otherwise processing Reed-Muller codes, Polar codes and variations thereof discussed in the first appended document, second appended document, or discussed herein with respect to the various figures that operate by combining in part or in whole the different components and code reductions to provide various other and further embodiments.

Various embodiments comprise systems and methods of applying recursive aggregation-projection algorithms to any code that supports the algorithm's operations (e.g., BCH, Reed-Solomon or expander codes). In particular, taking any code on a finite field, summing pairs of components based on a matching of the components, iterating this projection procedure a number of time until the obtained word is decoded by a specific algorithm, and reverting the projection parts with aggregation functions.

Figure 5:
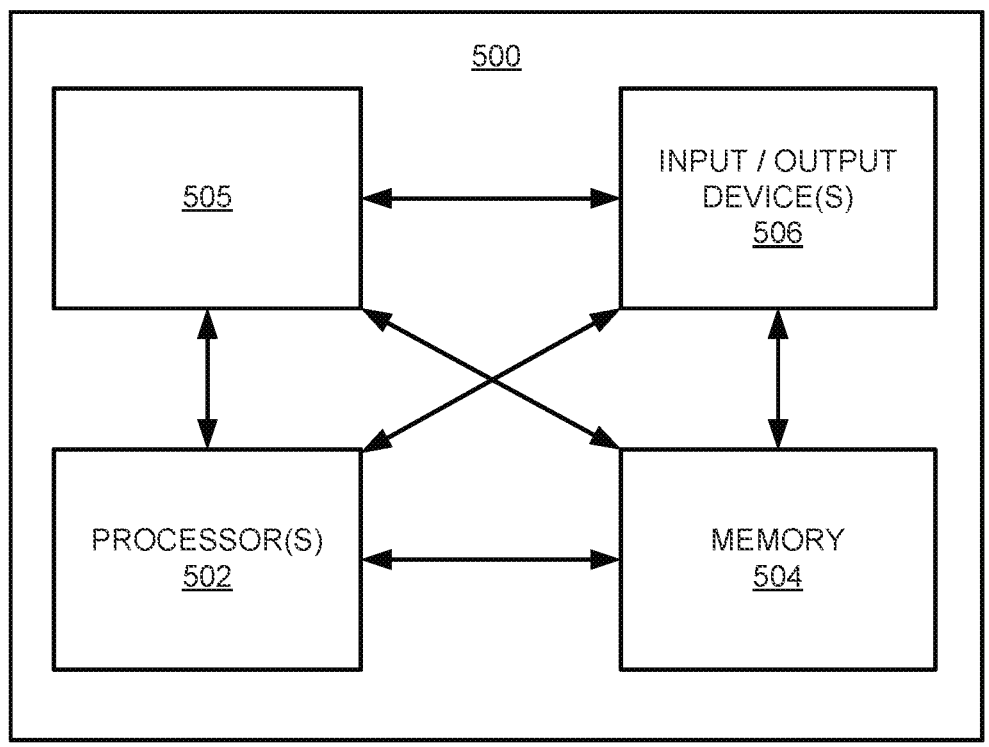
FIG. 5 depicts a high-level block diagram of a computing device suitable for use within the context of the various embodiments.

FIG. 5 depicts a high-level block diagram of a computing device, such as a channel decoder or other computing device, suitable for use in performing functions described herein such as those associated with the various elements described herein with respect to the figures.

As depicted in FIG. 5, computing device 500 includes a processor element 503 (e.g., a central processing unit (CPU) and/or other suitable processor(s)), a memory 504 (e.g., random access memory (RAM), read only memory (ROM), and the like), a cooperating module/process 505, and various input/output devices 506 (e.g., a user input device (such as a keyboard, a keypad, a mouse, and the like), a user output device (such as a display, a speaker, and the like), an input port, an output port, a receiver, a transmitter, and storage devices (e.g., a persistent solid state drive, a hard disk drive, a compact disk drive, and the like)).

It will be appreciated that the functions depicted and described herein may be implemented in hardware and/or in a combination of software and hardware, e.g., using a general purpose computer, one or more application specific integrated circuits (ASIC), and/or any other hardware equivalents. In one embodiment, the cooperating process 505 can be loaded into memory 504 and executed by processor 503 to implement the functions as discussed herein. Thus, cooperating process 505 (including associated data structures) can be stored on a computer readable storage medium, e.g., RAM memory, magnetic or optical drive or diskette, and the like.

It will be appreciated that computing device 500 depicted in FIG. 5 provides a general architecture and functionality suitable for implementing functional elements described herein or portions of the functional elements described herein.

It is contemplated that some of the steps discussed herein may be implemented within hardware, for example, as circuitry that cooperates with the processor to perform various method steps. Portions of the functions/elements described herein may be implemented as a computer program product wherein computer instructions, when processed by a computing device, adapt the operation of the computing device such that the methods and/or techniques described herein are invoked or otherwise provided. Instructions for invoking the inventive methods may be stored in tangible and non-transitory computer readable medium such as fixed or removable media or memory, and/or stored within a memory within a computing device operating according to the instructions.

Thus, various embodiments for decoding Reed-Muller (RM) encoded data may be implemented via code stored on a non-transient medium in or suitable for use with a receiver (e.g., a special purpose receiver or decoding portion therein, computing device implementing a receiver function or decoding function, and so on), by a receiver or decoding portion thereof configured to perform the method such as by executing such code, by a special purpose device configured for performing the method and so on.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

What is claimed is:

1. At a receiver coupled to a communications channel of a communications system, a method for decoding Reed-Muller (RM) encoded data received therefrom, the method comprising:
   receiving a communication signal comprising RM encoded data;
   for each received word of RM encoded data, projecting the received word onto each of a plurality of cosets of different subspaces to form thereby a respective plurality of projected words;
   recursively decoding each of the respective plurality of projected words to form a respective plurality of decoded projected words; and
   aggregating each of the respective decoded projected words to obtain thereby a decoding of the corresponding received word of RM encoded data.

2. The method of claim 1, wherein said projecting is performed in accordance with subspaces of dimension 1.

3. The method of claim 1, wherein said projecting is performed in accordance with subspaces greater than dimension 1 and fixed over a number of recursive decoding iterations.

4. The method of claim 1, wherein said projecting is performed in accordance with subspaces greater than dimension 1 and variable over a number of recursive decoding iterations.

5. The method of claim 1, wherein said aggregation is performed in accordance with a majority voting method.

6. The method of claim 1, wherein said aggregation is performed in accordance with one of a majority voting method, a multi-step power iteration method, a spectral method, and a semi-definite programming method.

7. The method of claim 1, wherein said aggregation selects only a subset of projected words according to a rule of selection based on the decoding of the projected words.

8. The method of claim 1, further comprising:
   decomposing of RM codes that reduce at least one of r and m parameters of the code individually using Plotkin transformation; and
   composing the decomposed RM codes with decoded projected word components.

9. The method of claim 1, wherein for each of the respective plurality of projected words, said steps of decoding and aggregating are performed in parallel.

10. The method of claim 1, wherein recursively decoding each of the respective plurality of projected words is performed via a respective parallel processing thread executed via one or more processors at the receiver.

11. The method of claim 10, wherein the receiver comprises multiple processors configured for executing one or more respective parallel processing threads.

12. An apparatus for decoding Reed-Muller (RM) encoded data, the apparatus comprising:
- a receiver comprising a memory, and at least one processor coupled to the memory, the receiver configured to:
  - receiving a communication signal comprising RM encoded data;
  - for each received word of RM encoded data, projecting the received word onto each of a plurality of cosets of different subspaces to form thereby a respective plurality of projected words;
  - recursively decoding each of the respective plurality of projected words to form a respective plurality of decoded projected words; and
  - aggregating each of the respective decoded projected words to obtain thereby a decoding of the corresponding received word of RM encoded data.

13. A tangible and non-transitory computer readable storage medium storing instructions which, when executed by a computer, adapt the operation of the computer to provide a method of decoding Reed-Muller (RM) encoded data received via a communications channel, the method comprising:
- receiving a communication signal comprising RM encoded data;
- for each received word of RM encoded data, projecting the received word onto each of a plurality of cosets of different subspaces to form thereby a respective plurality of projected words;
- recursively decoding each of the respective plurality of projected words to form a respective plurality of decoded projected words; and
- aggregating each of the respective decoded projected words to obtain thereby a decoding of the corresponding received word of RM encoded data.

14. A computer program product comprising a non-transitory memory comprising instructions for carrying out a method of decoding Reed-Muller encoded data received via a communication channel, whereby the method instructions are functionally operable for:
- receiving a communication signal comprising RM encoded data;
- for each received word of RM encoded data, projecting the received word onto each of a plurality of cosets of different subspaces to form thereby a respective plurality of projected words;
- recursively decoding each of the respective plurality of projected words to form a respective plurality of decoded projected words; and
- aggregating each of the respective decoded projected words to obtain thereby a decoding of the corresponding received word of RM encoded data.

15. A method for decoding Reed-Muller (RM) encoded data at a computing device comprising non-transitory memory for storing instructions for execution by one or more processors, the method comprising:
- receiving a communication signal comprising RM encoded data;
- for each received word of RM encoded data, mapping the received word onto a plurality of projected words via a code-specific projection technique;
- recursively decoding, via respective parallel processing threads, each of the respective plurality of projected words to form a respective plurality of decoded projected words;
- aggregating each of the respective decoded projected words to obtain thereby a decoding of the corresponding received word of the original code.

16. The method of claim 15, further comprising utilizing list-decoding and code concatenation.

\* \* \* \* \*